United States Patent [19]

Van Ormondt et al.

[11] Patent Number: 4,980,640

[45] Date of Patent: Dec. 25, 1990

[54] METHOD OF AND DEVICE FOR DETERMINING SPECTRUM PARAMETERS OF A SPECTRUM RELATED TO SPECTROSCOPIC SIGNALS

[75] Inventors: Dirk Van Ormondt; Ronald De Beer, both of Delft; Wilhelmus W.F. Pijnappel, Berkel-Enschot, Netherlands

[73] Assignee: U.S. Philips Corporation, New York, N.Y.

[21] Appl. No.: 340,619

[22] Filed: Apr. 19, 1989

[30] Foreign Application Priority Data

May 11, 1988 [NL] Netherlands ............... 8801234

[51] Int. Cl.$^5$ ............................................. G01R 33/46
[52] U.S. Cl. ................................. 324/307; 364/413.13
[58] Field of Search ............... 324/307, 308, 312, 316, 324/309; 364/498, 413.13; 250/282

[56] References Cited

U.S. PATENT DOCUMENTS

| 3,655,958 | 4/1972 | West | 364/498 |
| 4,520,316 | 5/1985 | Hall et al. | 324/309 |
| 4,716,368 | 12/1987 | Haacke | 324/308 |

OTHER PUBLICATIONS

P. Diehl et al., "Automatic Analysis of NMR Spectra: An Alternative Approach", Journal of Magnetic Resonance, vol. 19, No. 1, Jul. 1975, pp. 67–82.
De Beer et al., "Improved Harmonic Retrieval . . . Invoking Prior Knowledge", EUSIPCP-88, Sep. 5–8, 1988, Grenoble.

J. W. C. van der Veen et al., "Accurate Quantification of in Vivo $^{31}$P NMR Signals Using the Variable Projection Method and Prior Knowledge, Magnetic Resonance in Medicine", vol. 6, No. 1, Jan. 1988, pp. 92–98.
H. Barkhuisjen et al., "Improved Algorithm for Noninteractive Time–Domain Model Fitting to Exponentially Damped Magnetic Resonance Signals", Journal of Magnetic Resonance 73, pp. 553–557, 1987.
C. H. Sotak et al., "Automatic Phase Correction of Fourier Transform NMR Spectra Based on the Dispersion Versus Absorption (DISPA) Lineshape Analysis", Journal of Magnetic Resonance 57, pp. 453–962, 1984.

*Primary Examiner*—Hezron E. Williams
*Assistant Examiner*—Kevin D. O'Shea
*Attorney, Agent, or Firm*—Jack D. Slobod

[57] ABSTRACT

A method of and device for the determination with high computational efficiency of spectrum parameters of a spectrum utilizes quantification and model fitting of sampling values of a signal in the time domain on the basis of a model function comprising exponentially damped sinusoids. The method starts with a coarse estimation of a number of spectrum parameters, followed by linearization of the model function and iterative estimation of the coarsely estimated parameters and further parameters, utilizing a least-squares optimization procedure where inner product terms are brought into analytic form and are preferably recursively determined.

13 Claims, 4 Drawing Sheets $$\begin{bmatrix} \bar{c} \\ \mathrm{Re}\ \bar{c}' \\ \mathrm{Im}\ \bar{c}' \end{bmatrix} = \begin{bmatrix} M_1 & M_2 & M_3 \\ \tilde{M}_2 & M_4 & M_5 \\ \tilde{M}_3 & \tilde{M}_5 & M_6 \end{bmatrix}^{-1} \begin{bmatrix} \bar{v}_1 \\ \bar{v}_2 \\ \bar{v}_3 \end{bmatrix} \qquad (2A)$$

$$(M_1)_{kk'} = \mathrm{Re}\left[\sum_{n=0}^{N-1} f_k(t_n)\, f_{k'}^{*}(t_n)\right] \qquad k,k' = 1,\cdots, K \quad (2B)$$

$$(M_2 + iM_3)_{kk'} = \sum_{n=0}^{N-1} t_n\, f_k(t_n)\, f_{k'}^{*}(t_n) \qquad k,k' = 1,\cdots, K \quad (2C)$$

$$(M_4 + iM_5)_{kk'} = \sum_{n=0}^{N-1} t_n^2\, f_k(t_n)\, f_{k'}^{*}(t_n) \qquad k,k' = 1,\cdots, K \quad (2D)$$

$$M_6 = M_4 \qquad (2E)$$

$$(\bar{v}_1)_k = \mathrm{Re}\left[\sum_{n=0}^{N-1} f_k^{*}(t_n)\, x_n\right] \qquad k = 1,\cdots, K \quad (2F)$$

$$(\bar{v}_2 + i\bar{v}_3)_k = \sum_{n=0}^{N-1} t_n\, f_k^{*}(t_n)\, x_n \qquad k = 1,\cdots, K \quad (2G)$$

FIG. 2

$$S_l = \sum_{n=0}^{N-1} n^l z^n \qquad l = 0, 1, 2 \quad (3A)$$

$$S_0 = \frac{1 - z^N}{1 - z} \quad (3B)$$

$$S_l = \frac{z \sum_{m=0}^{l-1} \left(\begin{bmatrix} l \\ m \end{bmatrix} S_m\right) - N^l z^N}{1-z} \qquad l \geq 1 \quad (3C)$$

$$S_0 = \sum_{n=0}^{N-1} \begin{bmatrix} N \\ n+1 \end{bmatrix} eps^n \quad (3D)$$

$$S_1 = \sum_{n=0}^{N-1} \frac{(n+1)N - 1}{n+2} \begin{bmatrix} N \\ n+1 \end{bmatrix} eps^n \quad (3E)$$

$$S_2 = \sum_{n=0}^{N-1} \frac{(n+1)(n+2)N^2 - 3(n+1)N - n + 1}{(n+2)(n+3)} \begin{bmatrix} N \\ n+1 \end{bmatrix} eps^n \quad (3F)$$

FIG. 3

|     | $v_k$ | $\rho_k$ | $c_k$ | $\varphi_k$ |
|-----|-------|----------|-------|-------------|
| p1  | −7.7642±0.0038 | −0.074±0.024 | 388± 81 | 4±12 |
|     | −7.7630±0.0023 | −0.082±0.023 | 420± 75 | 0 |
| p2  | −7.5368±0.0106 | −0.193±0.066 | 650±214 | −21±19 |
|     | −7.5440±0.0074 | −0.335±0.077 | 1021±178 | 0 |
| p3  | −7.4072±0.0076 | −0.173±0.048 | 1181±417 | −24±20 |
|     | −7.4142±0.0023 | −0.115±0.025 | 678±118 | 0 |
| p4  | −7.3320±0.0108 | −0.203±0.068 | 1108±475 | 35±25 |
|     | −7.3158±0.0034 | −0.170±0.038 | 820±143 | 0 |
| p5  | −7.2279±0.0041 | −0.047±0.026 | 362±120 | −19±19 |
|     | −7.2318±0.0018 | −0.087±0.020 | 596± 97 | 0 |
| p6  | −7.1320±0.0014 | −0.112±0.009 | 2983±254 | −14± 4 |
|     | −7.1365±0.0005 | −0.101±0.005 | 2556± 87 | 0 |
| p7  | −7.0628±0.0084 | −0.173±0.053 | 909±313 | 56±20 |
|     | −7.0397±0.0032 | −0.076±0.032 | 286± 78 | 0 |
| p8  | −6.9742±0.0075 | −0.024±0.047 | 124± 80 | 29±36 |
|     | −6.9690±0.0031 | −0.057±0.032 | 220± 68 | 0 |
| p9  | −6.1432±0.0537 | −0.651±0.338 | 666±264 | −8±24 |
|     | −6.1743±0.0510 | −1.159±0.524 | 945±524 | 0 |
| p10 | −5.8401±0.0097 | −0.120±0.061 | 285±112 | −5±22 |
|     | −5.8417±0.0066 | −0.127±0.065 | 259±100 | 0 |
| p11 | −5.6772±0.0039 | −0.100±0.025 | 538± 94 | 4±10 |
|     | −5.6762±0.0021 | −0.086±0.020 | 482± 75 | 0 |
| p12 | −3.1745±0.0047 | −0.098±0.030 | 495±118 | −11±13 |
|     | −3.1769±0.0028 | −0.119±0.027 | 585± 97 | 0 |
| p13 | −3.1092±0.0036 | −0.083±0.023 | 535±112 | −6±12 |
|     | −3.1104±0.0018 | −0.064±0.019 | 430± 78 | 0 |
| p14 | −1.4206±0.0097 | −0.062±0.061 | 180±129 | −13±41 |
|     | −1.4221±0.0040 | −0.073±0.050 | 219±112 | 0 |
| p15 | −1.3540±0.0365 | −0.740±0.230 | 1613±327 | 15±12 |
|     | −1.3075±0.0202 | −0.744±0.177 | 1588±331 | 0 |
| p16 | −1.0660±0.0116 | −0.073±0.073 | 138± 93 | 2±39 |
|     | −1.0639±0.0059 | −0.091±0.059 | 190± 86 | 0 |
| p17 | −0.9049±0.0289 | −0.194±0.181 | 190±140 | −56±43 |
|     | −0.9256±0.0092 | −0.095±0.087 | 127± 78 | 0 |

FIG. 5

METHOD OF AND DEVICE FOR DETERMINING SPECTRUM PARAMETERS OF A SPECTRUM RELATED TO SPECTROSCOPIC SIGNALS

BACKGROUND OF THE INVENTION

1. Field of the Invention

The invention relates to a method of determining spectrum parameters of a spectrum relates to spectroscopic signals, in which method the spectroscopic signals derived from a substance are sampled in order to obtain sampling values and are approximated by a complex model function which contains the spectrum parameters and exponentially damped sinusoids, in which method there is also made an initial estimate, based on the sampling values, for at least one of the spectrum parameters, the at least one and further spectrum parameters being accurately estimated from the model function by iteration with a least-squares optimisation procedure, and prior knowledge is introduced into the model function.

The invention also relates to a device for determining spectrum parameters of a spectrum related to spectroscopic signals, which device comprises means for generating the spectroscopic signals in a substance, sampling means for obtaining sampling values from the spectroscopic signals, and displaying means for displaying the spectrum, and also comprises programmed means for making an initial estimate for at least one spectrum parameter, which programmed means also comprise a model function of exponentially damped sinusoids and are suitable for storing prior knowledge of the spectroscopic signals and for executing a least-square optimisation procedure on the basis of the sampling values, the programmed means furthermore comprising iteration means for accurately estimating, the at least one and further spectrum parameters by means of the least-squares optimisation procedure.

2. Description of the Prior Art

A method of this kind is inter alia suitable for signals which are mainly exponentially damped, for example for signals obtained during a magnetic resonance experiment from an entire body as the substance as well as from a part of the body. The method can also be used, for example for X-ray spectroscopy or FT infrared spectroscopy.

A method of this kind is disclosed in an article by J. W. C. van der Veen et al, "Accurate Quantification of in Vivo $^{31}P$ NMR Signals Using the Variable Projection Method and Prior Knowledge", Magnetic Resonance in Medicine, Vol. 6, No. 1, January 1988, pp. 92-98. The spectrum parameters of a spectrum related to spectroscopic signals (signals obtained during an NMR experiment) are derived via the sampling values (represented in a time domain, which is in contrast with the spectrum which is represented in a frequency domain), directly in the time domain. A least-squares optimisation procedure is used for fitting the sampling values to a model function of spectroscopic signals, in which procedure prior knowledge concerning spectral components can be introduced. The method can in principle be used for an arbitrary model function. In said article, for example a model function is assumed which contains exponentially damped sinusoids. By operation in the time domain, arbitrary parts of the spectroscopic signals can be omitted without giving rise to serious fitting problems. For example, when in the case of NMR the substance contains immobile nuclei and mobile nuclei, the sampling values (of a quickly exponentially decaying spectroscopic signal) originating from the immobile nuclei can be simply omitted. The sampling values of the tail of an exponentially decaying spectroscopic signal can also be omitted. Thus, convolution effects associated with a transformation to the frequency domain in conjunction with weighting, such as base line (wide background in the spectrum due to quickly decaying signals from the immobile nuclei) and line-shaped distortions (due to phase shifts) can be avoided. Fitting is performed partly non-iteratively in order to obtain an initial estimate for at least one of the spectrum parameters used as initial values for further iterative fitting. The non-iterative fitting is comparatively fast and the further iterative fitting enables the method to be used successfully also in the case of a poor signal-to-noise ratio. For parameters which occur linearly in the model function, such as complex amplitudes, no initial values are required, resulting in a faster method. Said article describes the method inter alia for a model function of exponentially damped sinusoids in which parameters such as amplitude, damping factor and frequency occur. Using the least-squares optimisation procedure, the sampling values are iteratively fitted as well as possible to the model function, initial values being required for the damping factor and frequencies which occur as non-linear parameters in the model function. The prior knowledge may comprise a time shift of an instant of a first sample with respect to a time origin and predetermined phases. The least-squares optimisation procedure can be written in the form of a matrix. This is represented by the formule 4 on page 94 of said article, showing a least-squares solution for the amplitude. All terms in the inverse matrix occurring therein are successively calculated, like the terms in the product of the Hermitic matrix with the data vector. In the matrix form a large number of product terms occur, so that a substantial amount of computation time is required for executing the method by means of a computer; this aspect becomes more significant in the case of a comparatively large number of sampling values.

SUMMARY OF THE INVENTION

It is an object of the invention to provide a method which, when the model function contains exponentially damped sinusoids, requires substantially less computation time when executed by means of a computer.

To achieve this, a method in accordance with the invention is characterized in that prior to the iteration the model function is linearised with respect to the at least one spectrum parameter, after which inner product terms occurring in the least-squares procedure are internally converted into an analytic form which is used during iteration. The number of columns of the matrix is increased with respect to the matrix in said article due to residual parameters which remain after linearisation, for example frequency and damping. The invention is based on the idea to convert first the inner product terms into analytic form in order to solve the least-squares problem in the case of exponentially damped sinusoids as the model function, rather than calculate, like in the known method, all matrix products one term after the other for all possible summations by means of row and column multiplications. The computation time is thus substantially reduced. In comparison with the known method, the method in accordance with the invention is 30 times faster in the case of 17 sinusoids and 512 sampling values. Random tests have shown that the Cramér-Rao lower limit for estimating the parameters is at least substantially reached, so that the method produces reliable parameters. The computation time increases in proportion to the first power of the number of sampling values, assuming that the other parameters, for example the number of sinusoids, remain the same.

A version of a method in accordance with the invention is characterized in that terms of the analytic form are recursively determined. Thus, the method can be simply implemented in a computer.

A version of a method in accordance with the invention is characterized in that the model function contains a polynomial whereby the exponentially damped sinusoids are multiplied. A sum of exponentially damped sinusoids does not always constitute a good model function in all circumstances. By multiplication by a polynomial, a model function is obtained which is adapted to circumstances. The inner product terms retain their comparatively simple form.

A version of a method in accordance with the invention is characterized in that the initial estimate of the spectrum parameters is made by means of a non-iterative estimation procedure. Initial values can thus be determined for parameters which occur non-linearly in the model function. For a non-iterative estimation procedure HSVD (Hankel matrix singular value decomposition) can be used as described in "Improved Algorithm for Noniterative Time-Domain Model Fitting to Exponentially Damped Magnetic Resonance Signals", H. Barkhuijsen et al, Journal of Magnetic Resonance 73, pp. 553–557, 1987.

A preferred version of a method in accordance with the invention is characterized in that the initial estimate of the spectrum parameters is made on the basis of a coarse spectrum obtained from the sampling values by Fourier transformation. In the case of a comparatively poor signal-to-noise ratio, first a filtering operation can be performed. Initial values of the parameters which occur non-linearly in the model function can be determined from the coarse spectrum. These parameters, frequency and damping, can be determined directly from a display screen on which the coarse spectrum is displayed by picking up, using a so-called mouse, at peak locations in the coarse spectrum the peak locations themselves (frequencies) and the peak width at half peak height (a measure of the damping) for supply to the programmed means in a computer. When the coarse spectrum contains excessive phase distortion, first a phase correction method incorporated in the programmed means can be executed, possibly after filtering (in the case of a comparatively poor signal-to-noise ratio), for example as described in an article by C. H. Sotak et al in Journal of Magnetic Resonance, Vol. 57, pp. 453–462, 1984. The phase correction of the coarse spectrum and the determination of the initial values can also be performed by means of a method as described in the non-prepublished Netherlands Patent Application No. 8702701 corresponding to the commonly owned U.S. patent application Ser. No. 270,923, filed Nov. 14, 1988, entitled "Method of and Device for Automatic Phase Correction of Complex NMR Spectra".

BRIEF DESCRIPTION OF THE DRAWING

The invention will be described in detail hereinafter with reference to a drawing, therein FIG. 1 diagrammatically shows a device in accordance with the invention.

FIG. 2 shows, in the form of a matrix, a set of linear equations in accordance with the invention, to be used for each iteration step during the iteration process, FIG. 3 shows the analytic form to be substituted, in accordance with the invention, in the set of linear equations given in FIG. 2, FIG. 5 shows a table containing parameters of the spectrum of FIG. 4.

DETAILED DESCRIPTION OF THE PREFERRED EMBODIMENTS

Figure 1:
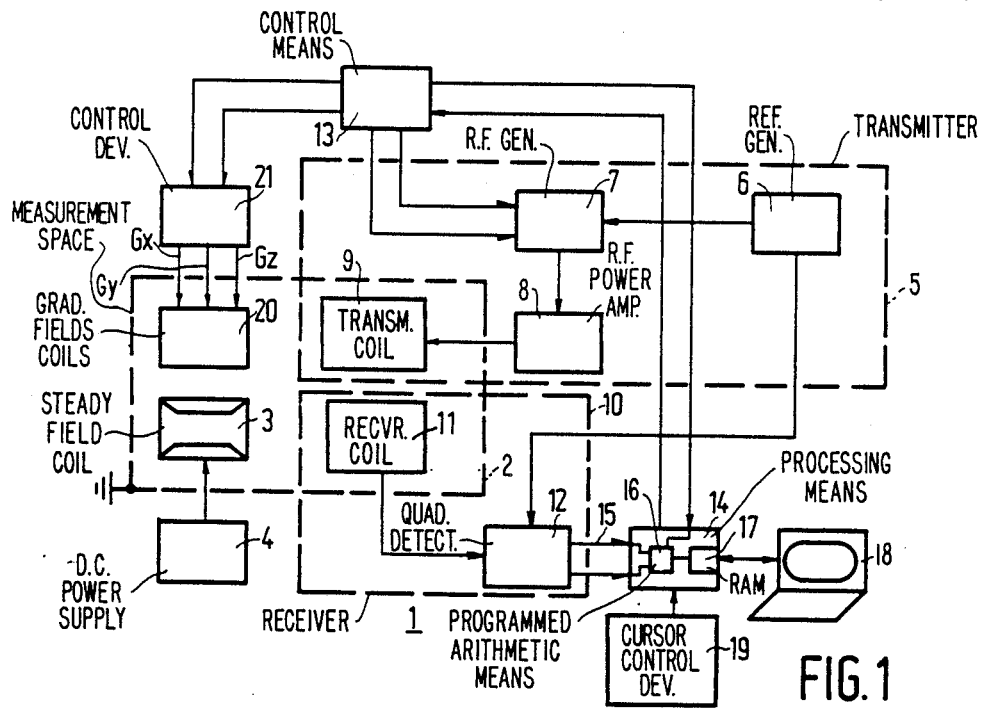

FIG. 1 diagrammatically shows a device 1 in accordance with the invention. Specifically a magnetic resonance device for obtaining spectroscopic signals is shown by way of example. The device 1 comprises magnet coils 3 for generating a steady, uniform magnetic field $B_0$ which are arranged within a measurement space 2. Within the magnet coils 3 there may be arranged a substance. The substance is, for example a body containing solid and liquid components. During operation of the device, the substance being arranged within the magnet coils 3, a slight excess of nuclear spins (of nuclei having a magnetic moment) will be oriented in the same direction as the field $B_0$. From a macroscopic point of view this is to be considered as a magnetisation M, i.e. an equilibrium magnetisation. The magnet coils 3 may be resistance magnets of superconducting magnets; the device then comprises a d.c. power supply source 4 for powering the magnet coils 3. When the magnet coils 3 are constructed as permanent magnets, the d.c. power supply source 4 will be omitted. The device 1 furthermore comprises transmitter means 5 for generating spectroscopic signals, which means include a reference generator 6 for generating a reference signal for supply to an r.f. modulator 7. When activated, the r.f. modulator 7, supplies an r.f. electromagnetic pulse to an r.f. power amplifier 8 which amplifies the r.f. electromagnetic pulse for supply to a transmitter coil 9 which is arranged near the magnet coils 3. When the substance arranged within the magnet coils is irradiated, the equilibrium of the magnetisation M is disturbed and after irradiation there will be generated a magnetic resonance signal when the magnetisation returns to the state of equilibrium, a so-called FID signal (Free Induction Decay). The resonance signal contains spectroscopic information; the signal will be referred to hereinafter as a spectroscopic signal. The device 1 also comprises receiver means 10 for receiving the spectroscopic signals, including a receiver coil 11 for receiving the spectroscopic signals which is connected to a detector 12 for the detection of the modulated spectroscopic signal, for example by quadrature detection. The detector 12, being coupled to the reference generator 6, comprises low-pass filters and analog-to-digital converters as the sampling means for sampling the spectroscopic signals received and detected. The device 1 also comprises control means 13 which serve inter alia for control and timing of the r.f. generator 7. The device furthermore comprises processing means 14 for processing digitised spectroscopic signals 15 (sampling values). The processing means 14 are coupled to the control means 13. The processing means 14 comprise programmed arithmetic means 16 inter alia for making an initial estimate for at least one spectrum parameter of a spectrum related to the spectroscopic signals in order to perform a least-squares optimisation procedure on the basis of the sampling values. The programmed means 16 furthermore is programmed to utilize a model function of exponentially damped sinusoids, to perform a non-iterative estimation procedure for determining the initial estimate, to perform the least-squares estimation procedure iteratively, and to perform Fourier transformation. Said programmed means may thus be considered as comprising, among other things, iteration means and Fourier transformation means (not shown in detail). The processing means 14 also comprise a RAM memory 17 which is coupled to the programmed means 16. The device 1 furthermore comprises display means 18, inter alia for the display of a spectrum of the spectroscopic signals. A cursor control device 19 is coupled to the display means 18 and the processing means 14. The cursor control device may be a so-called mouse or track ball; as is known, the mouse is formed by a carriage provided with a motion sensor which output signals in response to motion of the mouse. The signals of the motion sensor are applied to the processing means 14 which move a cursor as an indicator across a display screen of the display device in dependence of the signals of the motion sensor. When a given screen position is reached, the screen position can be applied to the processing means by operation of a control member on the mouse. Inter alia for spectroscopy of a part of the substance, so-called volume-selective spectroscopy, the device 1 comprises gradient coils 20 which are controlled by a gradient coil control device 21. The gradient coil control device 21 is controlled by the control means 13. The gradient coils 20 serve to generate field gradients which are superposed on the field $B_0$. Generally, there can be generated three gradients Gx, Gy and Gz whose field direction coincides with the direction of the steady, uniform magnetic field $B_0$ and the respective gradient directions of which extend mutually perpendicularly. For a more detailed description of a magnetic resonance device, reference is made to the handbook "Practical NMR Imaging", by M. A. Foster and J. M. S. Hutchinson, IRL Press, 1987, ISBN 1-85221-011-7, Chapter 1, pages 1–48 which describes the general principles of NMR and shows an NMR device. In the case of spectroscopy of the substance or part of the substance, the aim is to obtain information from the substance in the form of a spectrum (in the frequency domain). For NMR, where nuclear spins are excited in the steady field $B_0$, the relation $\omega = \gamma \cdot (1-\sigma) \cdot B_0$ holds for excitation of nuclear spins, where $\omega$ is a resonant frequency of the nuclear spins, gamma is a gyromagnetic ratio, and $\sigma$ is a so-called shielding constant of a nucleus. Spin resonance will occur when the resonant frequency is applied. From a macroscopic point of view this implies, vis-a-vis a stationary observer, a precessional motion of the magnetisation M around the field $B_0$ at the resonant frequency. When the substance contains nuclei having a different $\sigma$, the resonant frequency will also be different for these nuclei. This effect is referred to as chemical shift and becomes manifest as a different resonance peaks in a spectrum obtained from the resonance signal. In the time domain the resonance signal can in principle be described as a superposition of exponentially damped sinusoids. The chemical shifts are due to the fact that nuclei effectively experience a different magnetic field due to a different shielding under the influence of the presence of neighbouring electrons. The neighbouring electrons shield the nuclei to a given degree from the field $B_0$. Thus, chemical components can be identified in a substance by means of NMR spectroscopy. Depending on a selected frequency of the r.f. magnetic pulse, a given spectrum will be obtained. For example, a phosphorous spectrum ($^{31}P$), a carbon spectrum ($^{13}C$) or a proton spectrum ($^1H$) can be obtained. The surface are below the resonance peaks in the spectrum is directly proportional to the number of nuclei making a contribution for a given frequency. The surface area corresponds to the amplitude in the time domain. In addition to chemical shifts, another interaction also has an effect on the spectrum, the so-called spin-spin coupling which, which causes the splitting off of a resonance line which is usually small in comparison with the chemical shift. For a more detailed description of NMR spectroscopy reference is made to pages 249–274 of said handbook by Foster and Hutchinson.

FIG. 2 shows a set of linear equations (2A) to be used in accordance with the invention, for each iteration step during the iteration process. After an initial estimate of at least one spectrum parameter, frequency and damping of peaks occurring in the spectrum in the present example, the parameters frequency and damping and also amplitude are accurately estimated in a number of iteration steps on the basis of the set (2A). Therein, the column vector $\bar{c}$ relates to the amplitudes of the peaks of the spectrum and Re $\bar{c}$ represents the residual parameters $\Delta\rho$ of the damping $\rho$ and Im $\bar{c}$ represents the residual parameters $\Delta nu$ of the frequency nu, M1 to M6 being matrices in the partitioned form of the extended Fisher data matrix M of the least-squares problem, extended with columns for the residual parameters $\Delta\rho$ and $\Delta nu$ for all peaks, and $\bar{v}_1$ to $\bar{v}_3$ a representation of the sampling values. The set (2A) is formed by linearisation of the least-squares problem. The procedure is based on a model function for the magnetic resonance signal $x_n$ of the form:

$$x_n = \Sigma_k c_k \cdot \exp[(\rho_k + 2\pi i \cdot nu_k)(n+\delta) + i\phi_k] \quad (1)$$

where $x_n$ is a model function of the signal $x_n$, $c_k$, $nu_k$ and $\rho_k$ are parameters of the spectrum van $x_n$, being amplitude, frequency and damping, respectively, for $k = 1, \ldots, K$, in which K is the number of peaks in the model function. Furthermore, $i = (-1)^{\frac{1}{2}}$. First an initial estimate is made for $\rho_k$ and $nu_k$. In the working point ($\rho_0$, $nu_0$) obtained for the parameters $\rho$ and $nu$, for each k $x_n$ is linearised, producing terms of the form:

$$[c + (n+\delta)c'] \cdot \exp[(\rho_0 + 2\pi i \cdot nu_0)(n+\delta) + i\phi_0] \quad (2)$$

in $x_n$. $\rho = \rho_0 + \Delta\rho$ and $nu = nu_0 + \Delta nu$. Therein, n represents a sampling time of the resonance signal, $n = 0, 1, \ldots, N-1$ for N sampling operations at instants $t_n$, $\delta$ denotes a time shift cause by instrumental limitations and/or the deliberate omission of sampling values, $\phi_k$ denotes a phase shift. $\delta$ and $\phi_k$ can be introduced into the model $x_n$ as prior knowledge. Furthermore, after linearisation Re(c') = c$\Delta\rho$ and Im(c') = 2 $\pi$c$\Delta nu$, which can be simply demonstrated. Formules (2B) to (2G) follow from further elaboration of the least-squares problem after linearisation. In the formule (2A) to (2G), $\sim$ is a transposition and * is a complex conjugated operation. $f_k(t_n)$ is the $k^{th}$ model function. The information matrix is dimensioned to $3K \times 3K$. Furthermore:

$$f_k(t_n) = \exp[(\rho_k = 2\pi i \cdot nu_k)(n+\delta) + i\phi_k] \quad (3)$$

After each iteration step the current values of $\rho_k$ and $nu_k$ are replaced, utilising the current values of $c_{k'}$. When $\bar{c}'$ is sufficiently small, the iteration stops. A spectrum is obtained by transforming the model obtained after iteration to the frequency domain, for example by means of the Fourier transformation means. The spectrum can also be calculated directly from the spectrum parameters obtained, using known Lorentz formulas, so that any artefacts due to transformation are avoided. The spectrum is displayed by means of the display means 18. The spectrum parameters can also be represented in the form of a table; in that case the Fourier transformation may be omitted. Random tests have demonstrated that the so-called Cramér-Rao lower limit is at least substantially reached. For a further description of the Cramér-Rao lower limit in relation to the Fisher data matrix reference is made to "Handbook of Measurement Science", Vol. 1, P. H. Sydenham, 1982, Wiley, pp. 335-339. For a description of the generally known Fourier transformation means reference is made to the handbook "An Introduction to the Analysis and Processing of Signals" P. A. Lynn, McMillan 1983, pp. 57-64.

FIG. 3 shows the analytic form for the inner product terms to be substituted in the set of linear equations shown in FIG. 2. By elaborating in the formulas (2B) to (2G) the product $f_k(t_n)f_{k'}*(t_n)$, multiplied by a power of $t_{n'}$ for $f_k(t_n)$ in accordance with (3), terms according to (3A) in FIG. 3 are produced in as far as the part thereof which is dependent on the sampling instant is concerned; therein, 1 indicates the formules corresponding to the formules (2B), (2C) and (2D) in FIG. 2. In formule (3A):

$$z = \exp[\rho_k + \rho_{k'} + 2\pi i(nu_k - nu_{k'})] \qquad (4)$$

Formules (3B) and (3C) show recursive relations for the respective terms corresponding to $l=0$, 1 and 2. When $z$ approximates 1, an inaccuracy may occur when use is made of the recursive formules (3B) and (3C). By introducing the variable $eps = z - 1$, this problem can be circumvented. (3D) to (3F) show formules for use in such a case. The computation time required will then slightly increase again, notably in the case of a large N, because of the combinations occurring therein, for example when N exceeds $n+1$. Without substantial loss of accuracy truncation can take place for a suitable value of n, so that the computation efficiency is increased again. For example, in the case of 512 sampling values it will suffice to truncate the summing operations for, for example $n = 10$.

Figure 4:
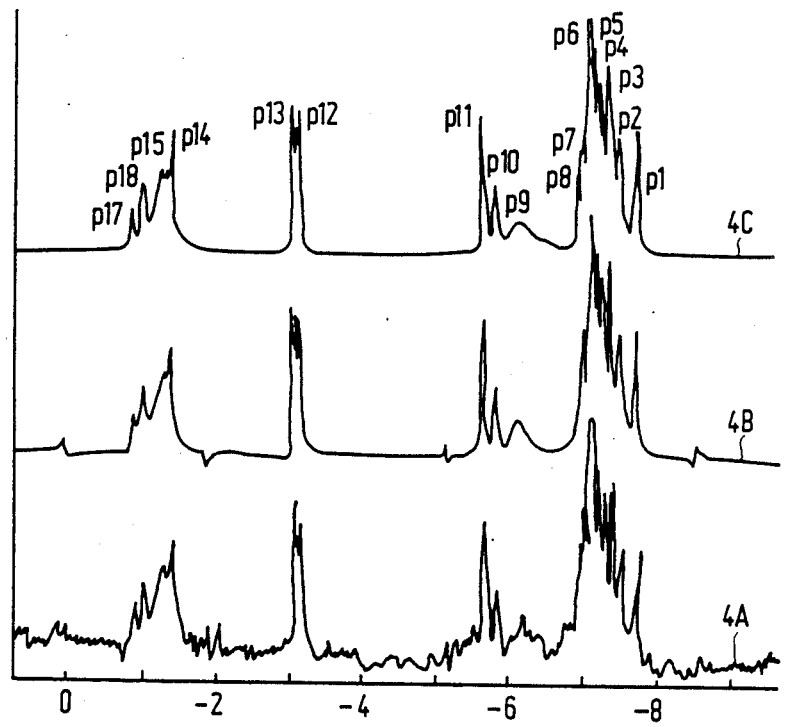
FIG. 4 shows a spectrum obtained by means of the method in accordance with the invention.

FIG. 4 shows a spectrum obtained by means of the method in accordance with the invention for in vivo $^{13}$C NMR spectroscopy of the liver of a rat. The number of complex sampling operation amounted to 512 with a sampling interval of 50 $\mu$s. The frequency scale is given in kHz relative to the irradiation frequency (the chemical shift appears as a spectrum). In FIG. 4 the reference 4A is the cosine FFT (Fast Fourier Transform) of the sampling values (a window is used in order to avoid artefacts), the reference 4B is a spectrum obtained by means of a method other than the method in accordance with the invention, and the reference 4C is the cosine FFT of the model which has been fitted in the time domain by means of the method in accordance with the invention and in which the prior knowledge concerning the phases has been introduced. In accordance with the invention, one operation step required 15 seconds, using the same device, whereas the known method required a period of time which is 30 times longer. The references p1 to p17 denote resonance peaks. The spectrum shown in FIG. 4C was obtained by means of 8 iteration steps.

FIG. 5 shows a table containing the parameters of the spectrum 4c in FIG. 4. The number of exponentially damped sinusoids was initially set at 25; it was found that 17 sinusoids were of spectroscopic relevance. For each resonance peak there are shown parameters obtained using a method other than the method in accordance with the invention, in this case by means of HSVD without utilising prior knowledge and therebelow the parameters obtained utilising the method in accordance with the invention with introduction of prior knowledge. The errors indicated amount to twice the standard deviation.

Many alternatives are feasible for those skilled in the art without departing from the scope of the invention. For example, in the case of NMR many pulse sequences can be used for spectroscopy in order to obtain resonance signals, both volume selective as well as non-volume selective. For a volume-selective pulse sequence use can be made of the SPARS method, as disclosed in Magnetic Resonance Imaging, Vol. 4, pp. 237-239, 1986. Even more prior knowledge can be used, for example information concerning multiplets in the spectrum. For a given signal-to-noise ratio for in vivo NMR, the use of prior knowledge will often be required in order to achieve suitable quantification.

We claim:

1. A method of determining spectrum parameters of a spectrum related to spectroscopic signals, in which method the spectroscopic signals derived from a substance are sampled in order to obtain sampling values and are approximated by a complex model function which contains the spectrum parameters and exponentially damped sinusoids, in which method there is also made an initial estimate, based on the sampling values, for at least one of the spectrum parameters, the at least one and further spectrum parameters being estimated from the model function by iteration with at least-squares optimisation procedure, and prior knowledge is introduced into the model function, characterized in that prior to the iteration the model function is linearised with respect to the at least one spectrum parameter, after which inner product terms occurring in the least-squares procedure are converted into an analytic form which is used during iteration.

2. A method as claimed in claim 1, characterized in that terms of the analytic form are recursively determined.

3. A method as claimed in claim 1, characterized in that the model function contains a polynomial whereby the exponentially damped sinusoids are multiplied.

4. A method as claimed in claim 1, characterized in that the initial estimate of the spectrum parameters is made by means of a non-iterative estimation procedure.

5. A method as claimed in claim 1, characterized in that the initial estimate of the spectrum parameters is made on the basis of a coarse spectrum obtained from the sampling values by Fourier transformation.

6. A method as claimed in claim 2, characterized in that the model function contains a polynomial whereby the exponentially damped sinusoids are multiplied.

7. A method as claimed in claim 2, characterized in that the initial estimate of the spectrum parameters is made by means of a non-iterative estimation procedure.

8. A method as claimed in claim 3, characterized in that the initial estimate of the spectrum parameters is made by means of a non-iterative estimation procedure.

9. A method as claimed in claim 2, characterized in that the initial estimate of the spectrum parameters is made on the basis of a coarse spectrum obtained from the sampling values by Fourier transformation.

10. A method as claimed in claim 3 characterized in that the initial estimate of the spectrum parameters is made on the basis of a coarse spectrum obtained from the sampling values by Fourier transformation.

11. A device for determining spectrum parameters of a spectrum related to spectrographic signals, which device comprises means for generating spectrographic signals in a substance, sampling means for obtaining sampling values from the generated spectrographic signals, programmed arithmetic means for determining said spectrum parameters by approximating said spectrographic signals with a complex model function which contains said spectrum parameters and exponentially damped sinusoids and is in a form introducing prior knowledge of the spectrographic signals into the model function, by making an initial estimate for at least one spectrum parameter, and by estimating based on the sampling values, using iteration, the at least one and further spectrum parameters with a least-squares optimization procedure, characterized in that prior to iteration the model function is linearized with respect to the at least one spectrum parameter, after which inner product terms occurring in the least-squares procedure are converted into an analytic form which is used during iteration.

12. A device as claimed in claim 11, characterized in that the programmed arithmetic means makes the initial estimate of the at least one spectrum parameter by a non-iterative estimation procedure.

13. A device as claimed in claim 11, wherein said programmed means further comprises means for determining a coarse spectrum by Fourier transformation of the sampling values, display means for displaying said coarse spectrum, and a cursor control device coupled to the programmed means for picking up parameters from the coarse spectrum for in making said initial estimate.

* * * * *